US006716691B1

(12) United States Patent
Evans et al.

(10) Patent No.: US 6,716,691 B1
(45) Date of Patent: Apr. 6, 2004

(54) SELF-ALIGNED SHALLOW TRENCH ISOLATION PROCESS HAVING IMPROVED POLYSILICON GATE THICKNESS CONTROL

(75) Inventors: David R. Evans, Beaverton, OR (US);
Sheng Teng Hsu, Camas, WA (US);
Bruce D. Ulrich, Beaverton, OR (US);
Douglas J. Tweet, Camas, WA (US);
Lisa H. Stecker, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/606,105

(22) Filed: Jun. 25, 2003

(51) Int. Cl.[7] ........................................ H01L 21/8238
(52) U.S. Cl. .................. 438/218; 438/219; 438/221; 438/401; 438/404; 438/424
(58) Field of Search ..................... 438/207, 218–219, 438/221, 401, 404, 424

(56) References Cited

U.S. PATENT DOCUMENTS 5,369,050 A * 11/1994 Kawai ........................ 438/401
5,733,801 A * 3/1998 Gojohbori .................. 438/401
5,907,762 A    5/1999 Evans et al.
6,133,106 A   10/2000 Evans et al.
6,200,866 B1   3/2001 Ma et al.
6,417,072 B2 * 7/2002 Coronel et al. ............. 438/424
6,624,039 B1 * 9/2003 Abdelgadir et al. ........ 438/401
6,627,510 B1 * 9/2003 Evans et al. ................ 438/401
2003/0119274 A1 * 6/2003 Weis ........................... 438/401
2003/0186503 A1 * 10/2003 Evans et al. ................ 438/424

* cited by examiner

Primary Examiner—Lynne Gurley
(74) Attorney, Agent, or Firm—David C. Ripma; Matthew D. Rabdau

(57) ABSTRACT

A method of fabricating a CMOS have self-aligned shallow trench isolation, includes preparing a silicon substrate; forming a gate stack; depositing a layer of first polysilicon; trenching the substrate by shallow trench isolation to form a trench; filling the trench with oxide; depositing a second layer of polysilicon wherein the top surface of the second polysilicon layer is above the top surface of the first polysilicon layer; depositing a sacrificial oxide layer having a thickness of at least 1.5× that of the first polysilicon layer; CMP the sacrificial oxide layer to the level of the upper surface of the second polysilicon layer; depositing a third layer of polysilicon; patterning and etching the gate stack; implanting ions to form a source region, a drain region and the polysilicon gate; and completing the CMOS structure.

15 Claims, 6 Drawing Sheets

SELF-ALIGNED SHALLOW TRENCH ISOLATION PROCESS HAVING IMPROVED POLYSILICON GATE THICKNESS CONTROL

FIELD OF THE INVENTION

This invention relates to CMOS Integrated circuit fabrication, and specifically to a method of shallow trench isolation for controlling polysilicon gate thickness and doping parameters.

BACKGROUND OF THE INVENTION

A number of procedures are known for providing shallow trench isolation during the fabrication of integrated circuits. One process is referred to as LOCOS, which is the locally selective oxidation isolation process, which has been used since the 1970's. The limitations of this process are that it tends to form a long birdsbeak, generates defects, segregates doping in the field region, etc. The birdsbeak reduces the effective channel width of the device and causes threshold voltage non-uniformity within the transistor. Defects can be generated around the perimeter of the device. The segregation of boron into the field oxide causes a reduction of field threshold voltage and increases the field leakage current. In the worst case, devices may become electrically connected through the field region.

The direct STI process is a simple shallow trench isolation process. Silicon trenches are etched through an oxide/nitride stack. The resulting trench is then re-filled and planarized using a chemical mechanical polishing (CMP) process. A disadvantage of this process is that the corner of the trench must be rounded to prevent the formation of a parasitic edge transistor and/or gate oxide breakdown at the edge of the active region. Consequently, this process also causes channel width reduction and threshold voltage non-uniformity. Another disadvantage is that, because of the flat final surface, there is no inherent alignment mark. An additional photoresist step and etch is required to produce an alignment key.

A modified STI process includes the growth of a gate oxide and deposition of a first polysilicon (polysilicon 1) layer after well formation. Silicon trenches are etched through the gate oxide/polysilicon 1 stack and then refilled with oxide, followed by a second polysilicon (polysilicon 2) layer deposition. Polysilicon 1 and polysilicon 2 are both incorporated into the gate polysilicon electrode. This process has a significant drawback in that post-polish thickness control of polysilicon 1 causes difficulty in end point detection of the gate polysilicon etch. This may be remedied by a reverse active area masking, or fabrication of dummy structures, before the CMP step. Also, as in the direct STI process, an additional photoresist step and etch is required to make the alignment marks. These represent additional steps which complicate the fabrication process, and which render the process more costly.

A self-aligned STI process is described in co-pending patent application, Evans et al., Method of Making Self-Aligned Shallow Trench Isolation Process, Ser. No. 10/112, 014, filed Mar. 29, 2002. In that disclosure, a second polysilicon layer is used, which, in the field region, has a surface below the level of the first polysilicon in the active region. After more oxide is deposited, a third polysilicon layer is deposited. The top surface of the second polysilicon layer provides the STI CMP stop. Global planarization may therefore be achieved without additional reverse mask photo and etching processes. The bottom surface of polysilicon 2 lies above the level of the bottom of polysilicon 1, and provides an end point for the gate electrode etch. This method, therefore, has a much wider process window than the modified STI process. Furthermore, alignment keys may be etched without an additional photo step. However, during CMP, polysilicon 1 is polished and may be thinned, resulting in the loss of some thickness control. This does not affect the etching of the gate, because the bottom of polysilicon 2 acts as an end point. However, it may affect the doping of the gate. If polysilicon 1 is too thin, the dopant may be implanted too deeply, resulting in, e.g., possible boron penetration in the case of PMOS devices.

Other references describes various gate replacement technology, including

U.S. Pat. No. 5,907,762, to Evans, et al., granted May 25, 1999, for Method of manufacture of single transistor ferroelectric memory cell using chemical-mechanical polishing, describes a technique for fabricating a FEM cell which does not suffer from FE layer degradation following a conventional etching process.

U.S. Pat. No. 6,133,106, to Evans, et al, granted Oct. 17, 2000, for Fabrication of a planar MOSFET with raised source/drain by chemical mechanical polishing and nitride replacement, describes fabrication of a planer MOSFET device with improved global planarization techniques, wherein the MOSFET device may be constructed on both conventional silicon and silicon-on-insulator (SOI) substrates, using of any type of gate dielectric material, and wherein the MOSFET device has a highly conductive material, such as refractory metal or copper, as the gate electrode. Further, the fabrication of the MOSFET device does not require dry etching of the gate electrode.

U.S. Pat. No. 6,200,866, to Ma, et al, granted Mar. 13, 2001, for Use of silicon germanium and other alloys as the replacement gate for the fabrication of MOSFET, describes use of silicon germanium and other Group IV-B elemental alloys as dummy, or replacement, gate structures during the fabrication of a MOSFET device. The method of the invention provides for replacement gate MOSFET fabrication process with improved etch selectivity between the replacement gate material and the adjacent materials, which are used in the spacers and other structures. The source region and the drain region are formed before formation of the gate in the method of the invention, and provides a fabrication process having increased controllability of the etch process to achieve a desired critical dimension of the gate.

SUMMARY OF THE INVENTION

A method of fabricating a CMOS have self-aligned shallow trench isolation includes preparing a silicon substrate, including forming well structures therein to provide an active area; forming a gate stack, including forming a gate insulation layer; depositing a layer of first polysilicon to a thickness $T_{P1} \pm \Delta T_{P1}$, where $T_{P1}$ is the desired thickness of the first polysilicon layer and $\Delta T_{P1}$ is the variation of the thickness of the first polysilicon layer, trenching the substrate by shallow trench isolation to form a trench having a depth $X_{STI} \pm \Delta X_{STI}$, where $X_{STI}$ is the desired depth of the trench and $\Delta X_{STI}$ is the variation of the depth of the trench; filling the trench with oxide to form a field oxide to a depth of $T_{OX} \pm \Delta T_{OX}$, where $T_{OX}$ is the desired thickness of the oxide $\Delta T_{OX}$ is the variation of the thickness of the oxide; depositing a second layer of polysilicon to a thickness $T_{P2} \pm \Delta T_{P2}$, where $T_{P2}$ is the desired thickness of the second polysilicon layer and $\Delta T_{P2}$ is the variation of the thickness of the second polysilicon layer, and wherein the top surface of the second polysilicon layer is above the top surface of the first polysilicon layer, and wherein $T_{P2} - \Delta T_{P2} + T_{OX} - \Delta T_{OX} > X_{STI} + \Delta X_{STI} + T_{P1} + \Delta T_{P1}$; depositing a sacrificial oxide layer having a thickness of at least 1.5× that of the first and second polysilicon layers; CMP the sacrificial oxide layer to the level of the upper surface of the second polysilicon layer; depositing a third layer of polysilicon; patterning and etching the gate stack; implanting ions to form a source region, a drain region and the polysilicon gate; and completing the CMOS structure.

It is an object of the invention to provide a method to improve the process window and consequent yield of a self-aligned STI process.

Another object of the invention is to provide a well-controlled and much more uniform polysilicon 1 thickness following CMP, leading to a well-controlled total polysilicon gate thickness.

A further object of the invention is to provide control of gate polysilicon thickness to facilitate accurate doping of the gate polysilicon.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Figure 1:
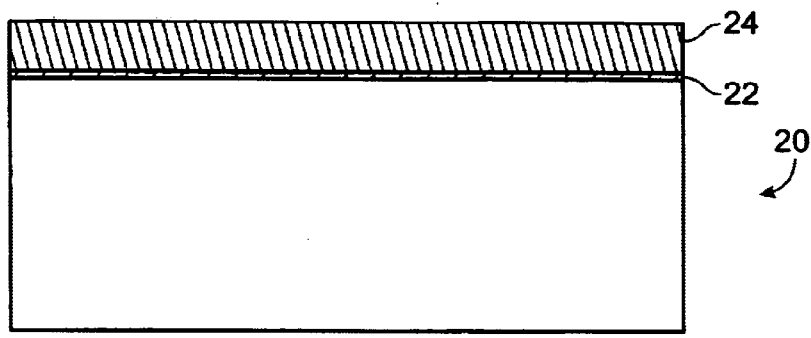
FIGS. 1 to 12 depict successive steps in the method of the invention.

Referring now to FIG. 1, the fabrication process begins with substrate 20 preparation on a silicon wafer, including formation of well structures, such as an n-well and a p-well. The substrate may also contain an epitaxial layer of silicon-germanium alloy. After the wells are formed, a gate insulator 22 is grown or deposited and the first polysilicon layer 24, i.e., polysilicon 1, is deposited. The thickness of polysilicon 1 is defined as $T_{P1}$. The gate insulator may comprise silicon oxide, silicon oxynitride, or a high-k dielectric, such as hafnium oxide, zirconium oxide, lanthanum oxide, aluminum oxide, their silicates, or other suitable material deposited by any state-of-the art method. FIG. 1 depicts the cross-section of only one transistor, however, one of ordinary skill in the art will understand that a CMOS transistor pair is constructed according to the method of the invention as exemplified by this description.

Figure 2:
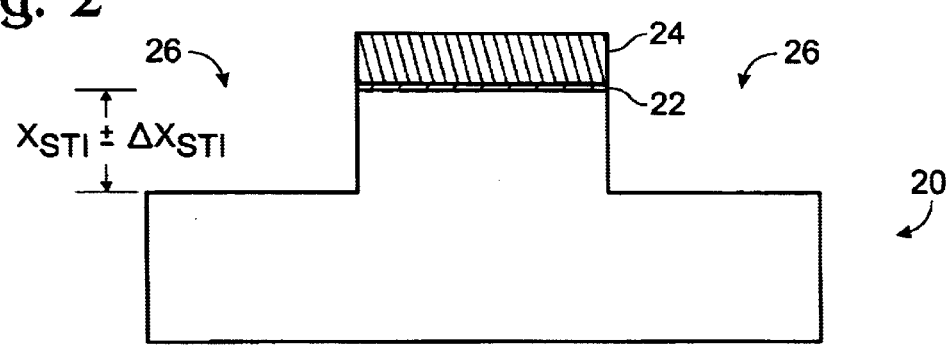

A simplified STI process is followed to etch silicon trenches 26 in the field region, as shown in FIG. 2. The depth of the trench, $X_{STI}$, is measured from the gate insulator to the bottom of the trench. The uncertainty, or variation, in the trench depth is referred to as $\Delta X_{STI}$.

Figure 3:
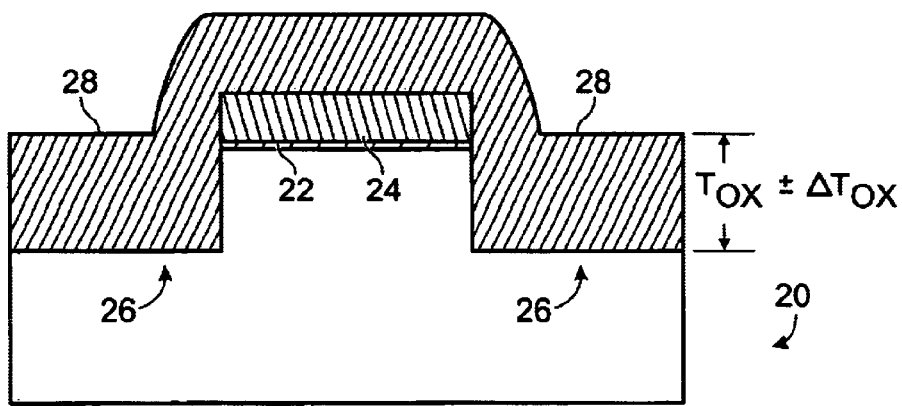

Referring to FIG. 3, any etching damage is cleaned, and the trench refilled with oxide 28. The oxide may consist of a thin thermal or other high quality oxide to provide a good oxide/silicon interface in the field followed by chemical vapor deposition (CVD) of oxide, such as LTO, HDPCVD, PECVD, etc. Non-CVD methods, such as sputtering, may also be used. The oxide may then be densified at higher temperature. The final processed thickness of the oxide is $T_{OX} \pm \Delta T_{OX}$, where $T_{OX} - \Delta T_{OX} > X_{STI} + \Delta X_{STI}$. This ensures that the oxide layer has a minimum thickness that is greater than the maximum possible depth of the trench.

Figure 4:
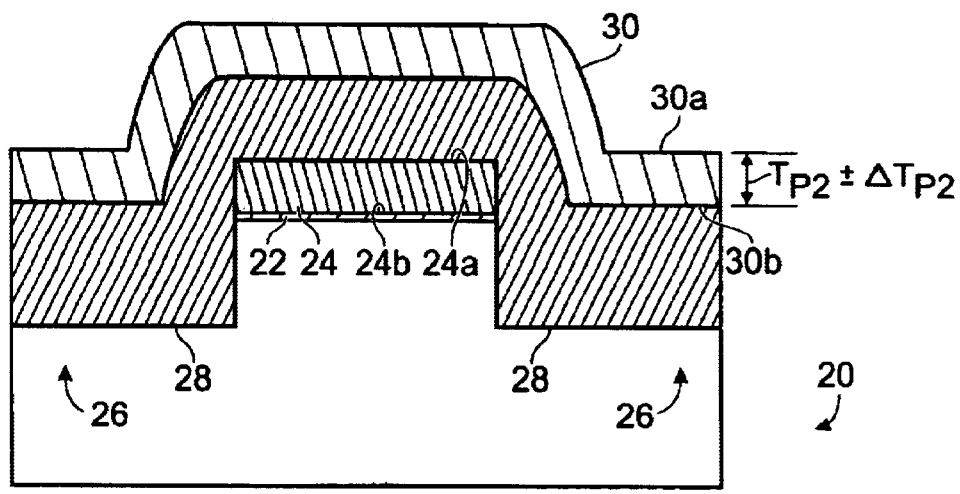

A second layer of polysilicon 30, polysilicon 2, is deposited, as depicted in FIG. 4. The thickness of polysilicon 2 is $T_{P2}$. The thickness of polysilicon 2 and the thickness of the oxide must together satisfy the condition of $T_{P2} - \Delta T_{P2} + T_{OX - \Delta TOX} > X_{STI} + \Delta X_{STI} + T_{P1} + \Delta T_{P1}$. This ensures that the minimum thickness of polysilicon 2 plus the minimum thickness of the oxide is greater than the maximum trench depth plus the maximum thickness of polysilicon 1. Consequently, the top surface 30a of polysilicon 2 in the field will be above the top surface 24a of polysilicon 1 in the active region. This condition is the major difference between the present disclosure and the co-pending patent application. Also, because of. The method described in connection with FIG. 3, above, the bottom surface 30b of polysilicon 2 in the field will be above the bottom surface 24b of polysilicon 1 in the active region. This latter condition is the same as that described in the co-pending application.

A sacrificial oxide layer (not shown) is next deposited. It is preferred that this oxide be more than 1.5 times thicker than polysilicon 1. Alternatively, the combined thickness of the gate insulator, polysilicon 1, the oxide layer, poly2, and the sacrificial oxide layer should be about twice the total step height of the active area features. The sacrificial oxide may be, for example, undensified TEOS.

Figure 5:
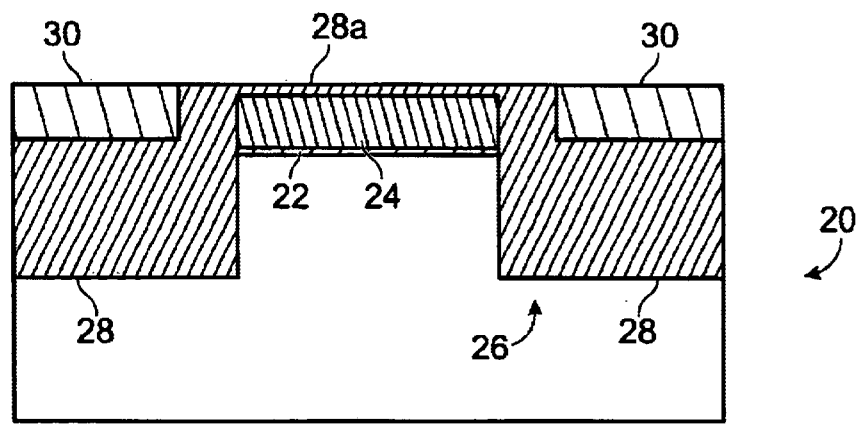

Referring to FIG. 5, the sacrificial oxide is CMPd, stopping at the level of polysilicon 2 in the field region. This may be done using a two step process. In the first step, a non-selective slurry is used to remove the overlying sacrificial oxide and that portion of the polysilicon 2 layer in the active areas. This is followed by a selective polish, which removes the remaining sacrificial oxide and stops on the polysilicon 2 layer in the field. The actual field oxide is not polished in this step. Because the device active area is much smaller than the field area, and the polish rate of oxide is, for the selective polish step, much higher than that of polysilicon, this selective CMP process may easily be achieved. Because $T_{P2} - \Delta T_{P2} + T_{OX} - \Delta T_{OX} > X_{STI} + \Delta X_{STI} + T_{P1} + \Delta T_{P1}$, there will be some thin oxide layer 28a remaining on polysilicon 1 in the active area after the CMP stop is reached.

Figure 6:
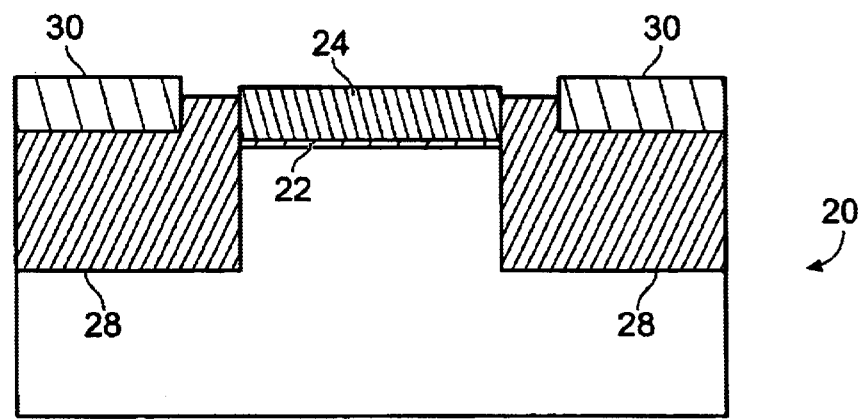

The thin oxide layer above polysilicon 1 is removed, as depicted in FIG. 6. This thin oxide is removed by a selective etch, for example, by a wet chemical etch. Care must be taken to etch long enough to remove all oxide from the surface of polysilicon 1 but not so long as to expose the edges of the gate insulator in the trenches.

Figure 7:
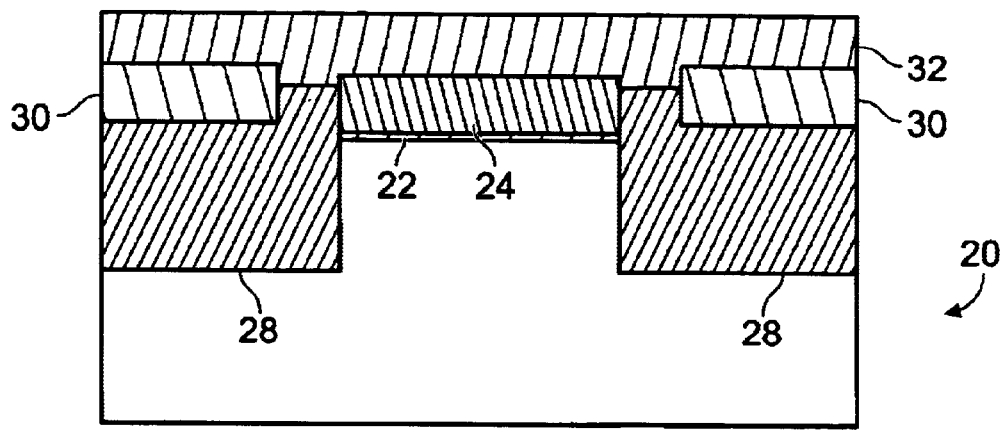

Turning now to FIG. 7, a third layer of polysilicon 32, polysilicon 3, is deposited. Polysilicon 3 is also referred to herein as a capping polysilicon layer. This step should be performed immediately after removal of the oxide above polysilicon 1, to prevent the formation of any oxide between polysilicon 1 and polysilicon 3. The actual gate polysilicon thickness is the sum of the thickness of polysilicon 3 and that of polysilicon 1. Because the surface of polysilicon 1 is not polished during CMP, its thickness has not been changed, thus, the total thickness of polysilicon 1+ polysilicon 3 is well controlled.

Figure 8:
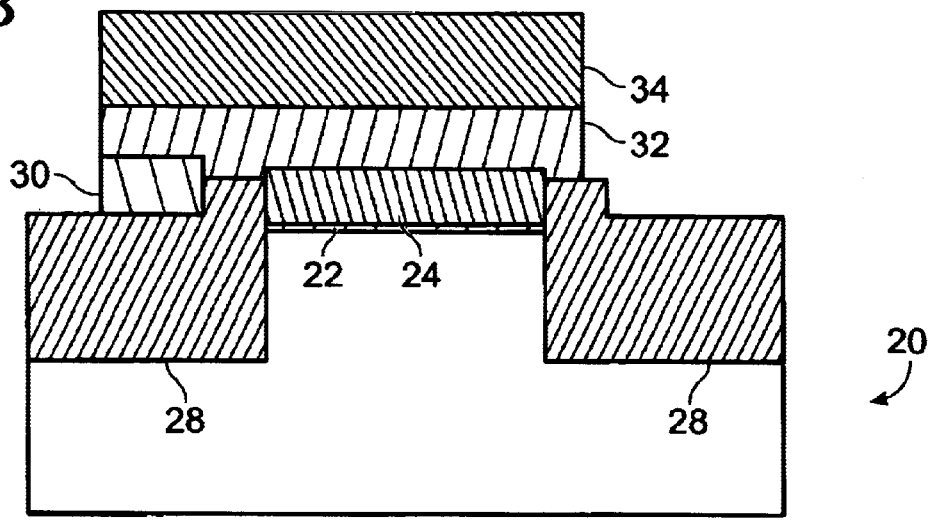
Figure 9:
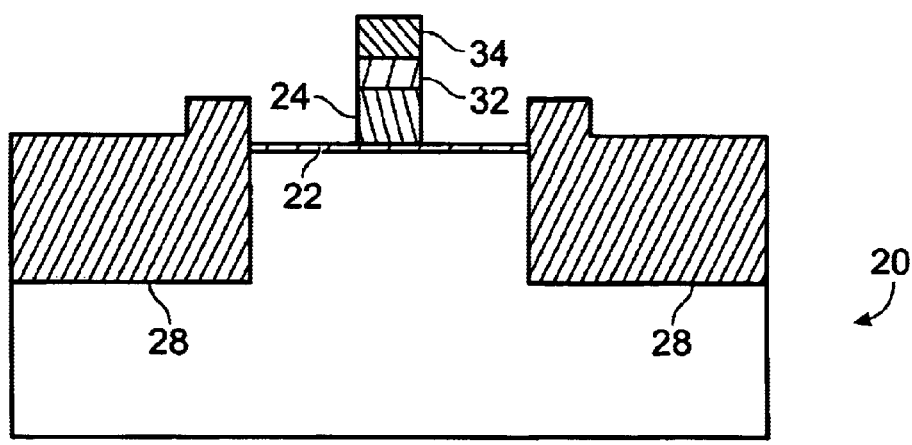
Figure 10:
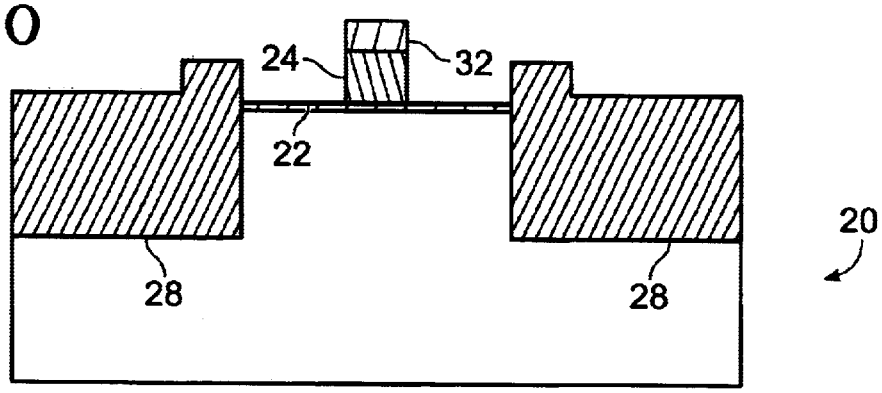

Referring to FIG. 8, the gate stack is etched. Initially, photoresist 34 is applied to define the gate electrode of the MOS transistors. A two step plasma etch process may then be used to etch the polysilicon 3/polysilicon 1 stack in the active region and the polysilicon 3/polysilicon 2 stack in the field. The first step has a high polysilicon etch rate that stops at the end point, which corresponds to the point at which exposed polysilicon 2 in the field region has been completely removed, as illustrated in FIG. 9. Notice that some polysilicon 2 remains under polysilicon 3 and the photoresist. Because $T_{OX}-\Delta T_{OX} > X_{STI}$, polysilicon 1 is not completely removed from the active region, as shown in FIG. 9, which is a cross-sectional view of the transistor along the source/channel/drain, and which is rotated 90° from that of FIG. 8. The thickness of the remaining polysilicon 1 should be independent of the CMP process. The next step is a highly selective etch which etches the remaining polysilicon 1 in the active region and stops at the gate oxide. Finally, the photoresist is removed. The polysilicon gate stack consists of the remaining portions of polysilicon 1 and polysilicon 3 over each active area, as shown in FIG. 10. Some polysilicon 2 remains under the portion of polysilicon 3 extending beyond the active region, which, however, is not visible in the view of FIG. 10.

Figure 11:
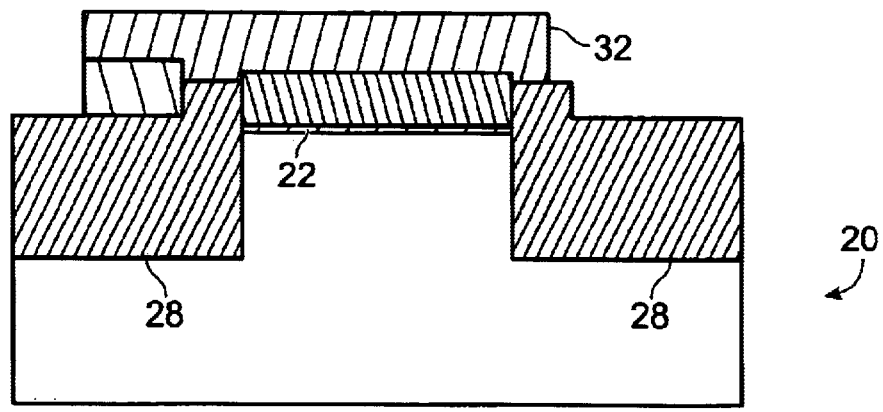
Figure 12:
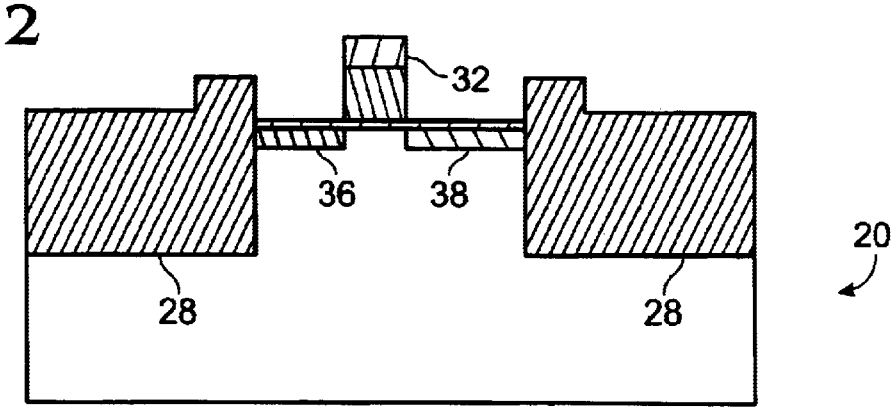

FIG. 11 depicts the structure after source/drain ion implantation, wherein polysilicon 1, polysilicon 2, and polysilicon 3 stacks are converted to n+ or p+ polysilicon using conventional implantation processes. The polysilicon gate can also be doped prior to the gate electrode etch and prior to the source and drain ion implant. The polysilicon gate can also be salicided. Any preferred state-of-the-art polysilicon gate doping or silicide process can be applied to the present process. The polysilicon gate structure following doping is shown in FIG. 11 and FIG. 12, wherein FIG. 12 is rotated 90° from FIG. 11. FIG. 12 also shows an implanted source region 36 and drain region 38. The careful control of the gate polysilicon thickness facilitates precise doping of the gate polysilicon and prevents dopant implantation into the channel region. The CMOS structure is now ready for completion according to state of the art techniques.

The advantages of the method of the invention are: (1) Polysilicon 2 is the STI CMP stop; global planarization may be achieved without additional reverse mask photoresist and etching processes; (2) The end point of the gate electrode etch is the bottom of polysilicon 2 and the thickness of the remaining polysilicon 1 is independent of the CMP process. This layer of polysilicon 1 can be selectively removed with a highly selective plasma etching process without excessive removal of gate oxide in the source and drain region; (3) Because polysilicon 1 in the active region is not polished during the CMP process its thickness is not changed. Therefore, the final thickness of the polysilicon 3/polysilicon 1 stack in the active region is the sum of the as-deposited polysilicon 1 and polysilicon 3 thicknesses. This should be well controlled and widens the process window for subsequent polysilicon doping and annealing; (4) This process also exhibits all the advantages of the modified STI process, such as negligible narrow channel effect, high gate oxide integrity, uniform threshold voltage across the transistor, and low field leakage current.

An alternative embodiment of the method of the invention uses the above-described method of the invention with a replacement gate process. In FIG. 1 "polysilicon 1" is replaced with a material such as polysilicon, polysilicon-germanium, silicon nitride, or other suitable material. Processing continues as already described up through FIG. 6. At this point "polysilicon 1" and "polysilicon 2" are removed, leaving a more or less standard STI structure on which to apply a dielectric layer and damascene gate. The CMOS structure is now ready for completion according to state of the art techniques.

Another embodiment of the method of the invention uses an alignment key, which is incorporated into the STI process described above, without the need for an additional photoresist and masking step. The process is nearly the same as that of the above method of the invention, except an oxide etch is added after the oxide CMP, which is similar to the method of the invention described in the co-pending patent application.

Figure 13:
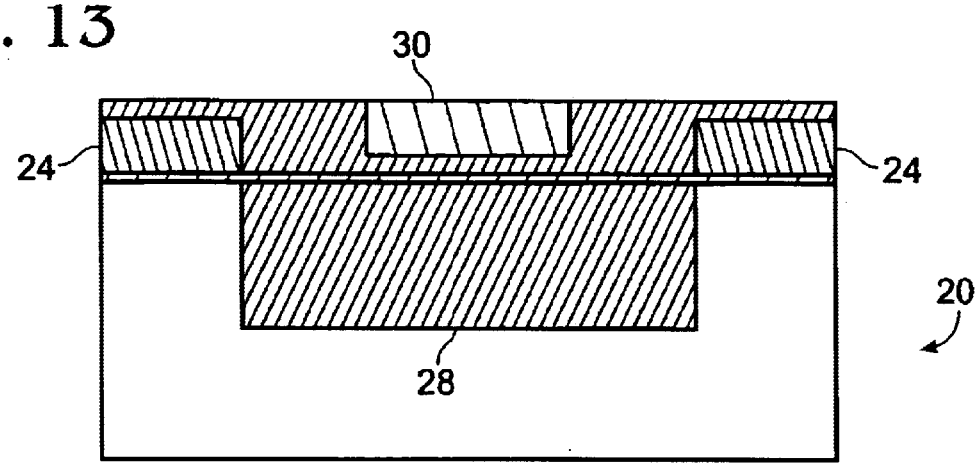
FIGS. 13 to 15 depict successive steps in an alternate embodiment of the method of the invention.
Figure 14:
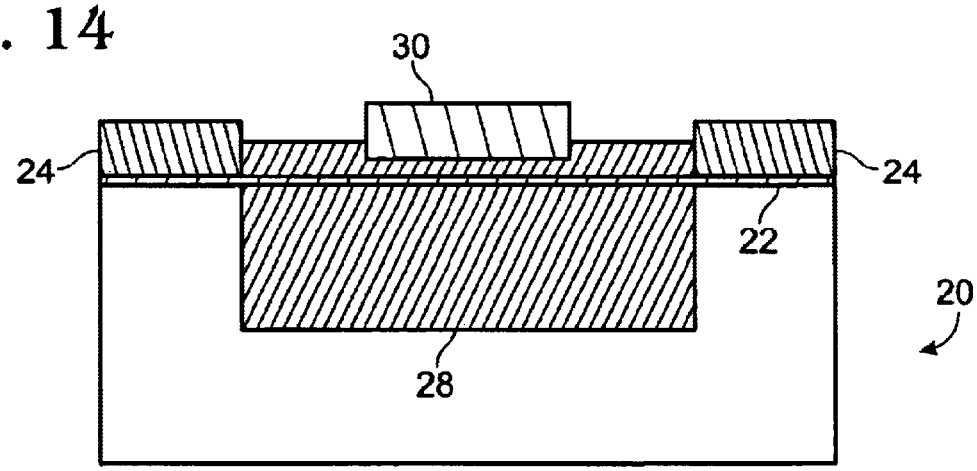

Referring now to FIG. 13, which depicts the trench region after oxide CMP, stopping at the top surface of polysilicon 2, which corresponds to FIG. 5. A selective oxide etch is used to remove an appropriate amount of oxide, e.g., about 100 nm, as shown in FIG. 14. This maybe either a plasma etch or a wet BHF etch. This same etch will also remove any oxide remaining above polysilicon 1 in the active region after CMP, as required in the method of the invention described in connection with FIG. 6. Care must be taken to not expose the gate oxide on the side of the trench.

Figure 15:
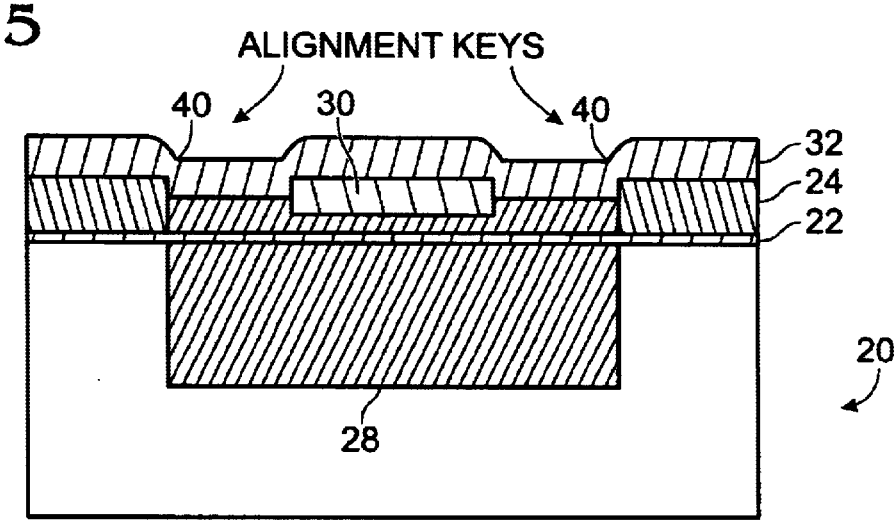

The next step in this embodiment is the deposition of polysilicon 3, as shown in FIG. 15, which corresponds to FIG. 7 in the primary method of the invention. The steps of polysilicon 3 at the edges of the STI trench form alignment keys 40. The process can then be completed as described above to form a final gate structure.

Figure 16:
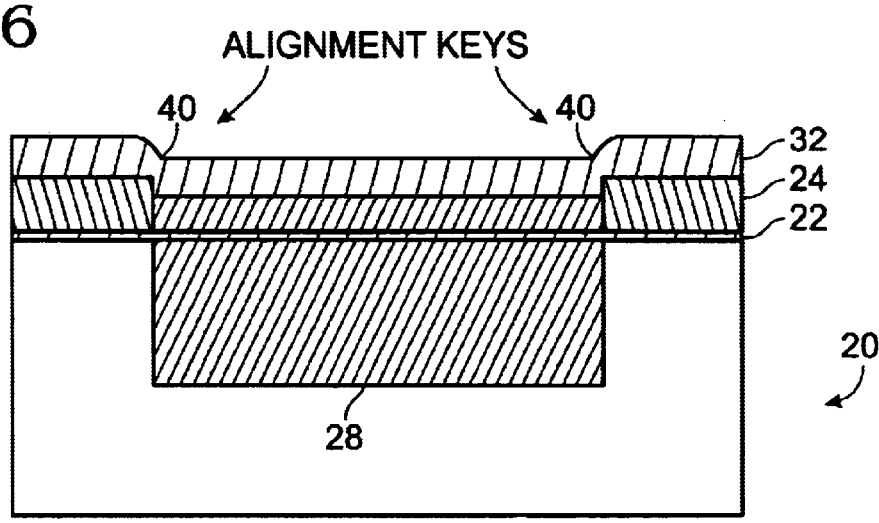
FIG. 16 depicts another embodiment of the method of the invention.

In yet another embodiment of the method of the invention, the same process can be used for a single polysilicon STI structure using a modified STI process where there is no polysilicon 2. The resulting structure, with edges that serve as alignment keys 40, is shown in FIG. 16. The alignment keys are formed by etching the oxide following CMP. After etching another polysilicon layer corresponding to polysilicon 3 is deposited, but in this case there was no polysilicon 2 used in the process. Subsequent processing may be performed to complete the device structure to form a transistor with a gate, source, and drain.

Thus, a method and system for a self-aligned shallow trench isolation process having improved polysilicon gate thickness control has been disclosed. It will be appreciated that further variations and modifications thereof may be made within the scope of the invention as defined in the appended claims.

We claim:

1. A method of fabricating a CMOS having self-aligned shallow trench isolation, comprising:
    preparing a silicon substrate, including forming well structures therein to provide an active area;
    forming a gate stack, including forming a gate insulation layer;
    depositing a layer of first polysilicon to a thickness $T_{P1} \pm \Delta T_{P1}$, where $T_{P1}$ is the desired thickness of the first polysilicon layer and $\Delta T_{P1}$ is the variation of the thickness of the first polysilicon layer;
    trenching the substrate by shallow trench isolation to form a trench having a depth $X_{STI} \pm \Delta X_{STI}$, where $X_{STI}$ is the desired depth of the trench and $\Delta X_{STI}$ is the variation of the depth of the trench;
    filling the trench with oxide to form a field oxide to a depth of $T_{OX} \pm \Delta T_{OX}$, where $T_{OX}$ is the desired thickness and of the oxide $\Delta T_{OX}$ is the variation of the thickness of the oxide;
    depositing a second layer of polysilicon to a thickness $T_{P2} \pm \Delta T_{P2}$, where $T_{P2}$ is the desired thickness of the second polysilicon layer and $\Delta T_{P2}$ is the variation of the thickness of the second polysilicon layer, and wherein the top surface of the second polysilicon layer is above the top surface of the first polysilicon layer, and wherein $T_{P2}-\Delta T_{P2}+T_{OX}-\Delta T_{OX}>X_{STI}+\Delta X_{STI}+T_{P1}+\Delta T_{P1}$;

depositing a sacrificial oxide layer having a thickness of at least 1.5× that of the first polysilicon layer;

CMP the sacrificial oxide layer to the level of the upper surface of the second polysilicon layer;

depositing a third layer of polysilicon;

patterning and etching the gate stack;

implanting ions to form a source region, a drain region and the polysilicon gate; and completing the CMOS structure.

2. The method of claim 1 which includes, after said CMP of the sacrificial oxide, selectively etching any remaining oxide on the top surface of the first polysilicon layer.

3. The method of claim 1 wherein said patterning and etching includes a two-step plasma etching process, including removing the overlying sacrificial oxide and that portion of the second polysilicon layer in the active areas with a non-selective slurry, and selectively polishing the structure to remove the remaining sacrificial oxide, stopping at the level of the second polysilicon layer in the field regions without polishing the field oxide.

4. The method of claim 1 wherein said filling the trench with oxide, includes filling the trench with an oxide taken from the group of oxides consisting of silicon oxide, silicon oxynitride, and a high-k dielectric taken from the group of high-k dielectrics consisting of hafnium oxide, zirconium oxide, lanthanum oxide, aluminum oxide, their silicates, and other suitable insulating material.

5. A method of fabricating a CMOS having self-aligned shallow trench isolation, comprising:

preparing a silicon substrate, including forming well structures therein to provide an active area;

forming a gate stack, including forming a gate insulation layer;

depositing a first polysilicon layer to a thickness $T_{P1}\pm\Delta T_{P1}$, where $T_{P1}$ is the desired thickness of the first polysilicon layer and $\Delta T_{P1}$ is the variation of the thickness of the first polysilicon layer;

trenching the substrate by shallow trench isolation to form a trench having a depth $X_{STI}\pm\Delta X_{STI}$, where $X_{STI}$ is the desired depth of the trench and $\Delta X_{STI}$ is the variation of the depth of the trench;

filling the trench with oxide to form a field oxide to a depth of $T_{OX}\pm\Delta T_{OX}$, where $T_{OX}$ is the desired thickness and of the oxide $\Delta T_{OX}$ is the variation of the thickness of the oxide;

depositing a second layer of polysilicon to a thickness $T_{P2}\pm\Delta T_{P2}$, where $T_{P2}$ is the desired thickness of the second polysilicon layer and $\Delta T_{P2}$ is the variation of the thickness of the second polysilicon layer, and wherein the top surface of the second polysilicon layer is above the top surface of the first polysilicon layer, and wherein $T_{P2}-\Delta T_{P2}+T_{OX}-\Delta T_{OX}>X_{STI}+\Delta X_{STI}+T_{P1}+\Delta T_{P1}$;

depositing a sacrificial oxide layer having a thickness of at least 1.5× that of the first polysilicon layer;

CMP the sacrificial oxide layer to the level of the upper surface of the second polysilicon layer;

removing the first and second polysilicon layers;

forming a dielectric layer;

forming a damascene gate structure depositing a third layer of polysilicon;

patterning and etching the gate stack;

implanting ions to form a source region, a drain region and the polysilicon gate; and completing the CMOS structure.

6. The method of claim 5 wherein said patterning and etching includes a two-step plasma etching process, including removing the overlying sacrificial oxide and that portion of the second polysilicon layer in the active areas with a non-selective slurry, and selectively polishing the structure to remove the remaining sacrificial oxide, stopping at the level of the second polysilicon layer in the field regions without polishing the field oxide.

7. The method of claim 6 wherein said filling the trench with oxide includes filling the trench with an oxide taken from the group of oxides consisting of silicon oxide, silicon oxynitride, and a high-k dielectric taken from the group of high-k dielectrics consisting of hafnium oxide, zirconium oxide, lanthanum oxide, aluminum oxide, their silicates, and other suitable insulating material.

8. A method of fabricating a CMOS having self-aligned shallow trench isolation, comprising:

preparing a silicon substrate, including forming well structures therein to provide an active area;

forming a gate stack, including forming a gate insulation layer;

depositing a layer of first polysilicon to a thickness $T_{P1}\pm\Delta T_{P1}$, where $T_{P1}$ is the desired thickness of the first polysilicon layer and $\Delta T_{P1}$ is the variation of the thickness of the first polysilicon layer;

trenching the substrate by shallow trench isolation to form a trench having a depth $X_{STI}\pm\Delta X_{STI}$, where $X_{STI}$ is the desired depth of the trench and $\Delta X_{STI}$ is the variation of the depth of the trench;

filling the trench with oxide to form a field oxide to a depth of $T_{OX}\pm\Delta T_{OX}$, where $T_{OX}$ is the desired thickness of the oxide $\Delta T_{OX}$ is the variation of the thickness of the oxide;

depositing a second layer of polysilicon to a thickness $T_{P2}\pm\Delta T_{P2}$, where $T_{P2}$ is the desired thickness of the second polysilicon layer and $\Delta T_{P2}$ is the variation of the thickness of the second polysilicon layer, and wherein the top surface of the second polysilicon layer is above the top surface of the first polysilicon layer, and wherein $T_{P2}-\Delta T_{P2}+T_{OX}-\Delta T_{OX}>X_{STI}+\Delta X_{STI}+T_{P1}+\Delta T_{P1}$;

depositing a sacrificial oxide layer having a thickness of at least 1.5× that of the first polysilicon layer;

CMP the sacrificial oxide layer to the level of the upper surface of the second polysilicon layer;

selectively etching the oxide;

depositing a third layer of polysilicon to form an alignment key at the edge of the trench;

patterning and etching the gate stack;

implanting ions to form a source region, a drain region and the polysilicon gate; and completing the CMOS structure.

9. The method of claim 8 which includes, after said CMP of the sacrificial oxide, selectively etching any remaining oxide on the top surface of the first polysilicon layer.

10. The method of claim 8 wherein said patterning and etching includes a two-step plasma etching process, including removing the overlying sacrificial oxide and that portion of the second polysilicon layer in the active areas with a non-selective slurry, and selectively polishing the structure to remove the remaining sacrificial oxide, stopping at the level of the second polysilicon layer in the field regions without polishing the field oxide.

11. The method of claim 8 wherein said filling the trench with oxide includes filling the trench with an oxide taken from the group of oxides consisting of silicon oxide, silicon oxynitride, and a high-k dielectric taken from the group of high-k dielectrics consisting of hafnium oxide, zirconium oxide, lanthanum oxide, aluminum oxide, their silicates, and other suitable insulating material.

12. A method of fabricating a CMOS having self-aligned shallow trench isolation, comprising:

preparing a silicon substrate, including forming well structures therein to provide an active area;

forming a gate stack, including forming a gate insulation layer;

depositing a layer of first polysilicon to a thickness $T_{P1} \pm \Delta T_{P1}$, where $T_{P1}$ is the desired thickness of the first polysilicon layer and $\Delta T_{P1}$ is the variation of the thickness of the first polysilicon layer;

trenching the substrate by shallow trench isolation to form a trench having a depth $X_{STI} \pm \Delta X_{STI}$, where $X_{STI}$ is the desired depth of the trench and $\Delta X_{STI}$ is the variation of the depth of the trench;

filling the trench with oxide to form a field oxide to a depth of $T_{OX} \pm \Delta T_{OX}$, where $T_{OX}$ is the desired thickness and of the oxide $\Delta T_{OX}$ is the variation of the thickness of the oxide;

depositing a sacrificial oxide layer having a thickness of at least 1.5× that of the first polysilicon layer;

CMP the sacrificial oxide layer to the level of the upper surface of the first polysilicon layer;

depositing a capping polysilicon layer to form an alignment key at the edge of the trench;

patterning and etching the gate stack;

implanting ions to form a source region, a drain region and the polysilicon gate; and completing the CMOS structure.

13. The method of claim 12 which includes, after said CMP of the sacrificial oxide, selectively etching any remaining oxide on the top surface of the first polysilicon layer.

14. The method of claim 12 wherein said patterning and etching includes a two-step plasma etching process, including removing the overlying sacrificial oxide and that portion of the first polysilicon layer in the active areas with a non-selective slurry, and selectively polishing the structure to remove the remaining sacrificial oxide, stopping at the level of the first polysilicon layer in the field regions without polishing the field oxide.

15. The method of claim 12 wherein said filling the trench with oxide includes filling the trench with an oxide taken from the group of oxides consisting of silicon oxide, silicon oxynitride, and a high-k dielectric taken from the group of high-k dielectrics consisting of hafnium oxide, zirconium oxide, lanthanum oxide, aluminum oxide, their silicates, and other suitable insulating material.

* * * * *